(12) United States Patent
Nishi et al.

(10) Patent No.: US 11,940,663 B2
(45) Date of Patent: Mar. 26, 2024

(54) OPTICAL DEVICE

(71) Applicant: Nippon Telegraph and Telephone Corporation, Tokyo (JP)

(72) Inventors: Hidetaka Nishi, Tokyo (JP); Shinji Matsuo, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 322 days.

(21) Appl. No.: 17/612,505

(22) PCT Filed: May 28, 2019

(86) PCT No.: PCT/JP2019/021067
§ 371 (c)(1),
(2) Date: Nov. 18, 2021

(87) PCT Pub. No.: WO2020/240689
PCT Pub. Date: Dec. 3, 2020

(65) Prior Publication Data
US 2022/0206235 A1    Jun. 30, 2022

(51) Int. Cl.
G02B 6/43    (2006.01)
G02B 6/122   (2006.01)
G02B 6/42    (2006.01)
H01L 31/0232 (2014.01)
H01L 31/101  (2006.01)
H01L 31/108  (2006.01)

(52) U.S. Cl.
CPC ............. *G02B 6/43* (2013.01); *G02B 6/1226* (2013.01); *G02B 6/4212* (2013.01); *H01L 31/02327* (2013.01); *H01L 31/101* (2013.01); *H01L 31/108* (2013.01)

(58) Field of Classification Search
CPC ...... G02B 6/43; G02B 6/4212; G02B 6/1226; H01L 31/108; H01L 31/02327; H01L 31/101
See application file for complete search history.

(56) References Cited

U.S. PATENT DOCUMENTS

2017/0194514 A1* 7/2017 Mühlbrandt .... H01L 31/022408
2020/0176627 A1   6/2020 Yu et al.

FOREIGN PATENT DOCUMENTS

WO    2019038598 A1    2/2019

OTHER PUBLICATIONS

Harter, T. et al., "Silicon-Plasmonic Photomixer for Generation and Homodyne Reception of Continuous-Wave THz Radiation," Conference on Lasers and Electro-Optics, Jun. 5, 2016, 2 pages.

(Continued)

*Primary Examiner* — Michael P Mooney
(74) *Attorney, Agent, or Firm* — Slater Matsil, LLP

(57) ABSTRACT

An optical device includes a core formed on a substrate, a first source electrode and a second source electrode formed in contact with both side surfaces of the core interposed between the first source electrode and the second source electrode, and a drain electrode formed in contact with an upper surface of the core. The core, the first source electrode, and the second source electrode together form a plasmonic waveguide. The first source electrode and the second source electrode are Schottky coupled to the core.

10 Claims, 4 Drawing Sheets

(56) References Cited

OTHER PUBLICATIONS

Muehlbrandt, S. et al., "Silicon-Plasmonic Internal-Photoemission Detector for 40 Gbit/s Data Reception," Research Article, Optical Society of America, Optica, vol. 3, No. 7, Jul. 2016, 7 pages.
Nishi, H. et al., "Deep-Subwavelength Si Core Plasmonic Waveguide Monolithically Integrated with Si Photonic Waveguide," Conference on Lasers and Electro-Optics, Optical Society of America, Jun. 5, 2016, 2 pages.
Nishi, H. et al., "High-Speed Si Plasmonic Photodetector Based on Internal Photoemission and Two-Photon Absorption," Conference on Lasers and Electro-Optics, May 13, 2018, 2 pages.

* cited by examiner

-- PRIOR ART --

-- PRIOR ART --

-- PRIOR ART --

OPTICAL DEVICE

This patent application is a national phase filing under section 371 of PCT/JP2019/021067, filed on May 28, 2019, which is incorporated herein by reference in its entirety.

TECHNICAL FIELD

The present invention relates to a plasmonic waveguide optical device.

BACKGROUND

To realize the application of an ultrasmall high-speed optical waveguide device to ultrahigh-speed optical communication or terahertz-wave communication, attention is paid to plasmonic waveguides capable of confining light in an area of subwavelength size. One example is a plasmonic-waveguide photodetector (PD). This kind of PD has a device structure simpler than the device structure of a known PD, and it is relatively easy to manufacture this kind of PD. Additionally, this PD is ultrasmall, and the product of capacity and resistance (CR product) is relatively small. By using the plasmonic-waveguide PD to exploit these characteristics, a high-speed PD capable of receiving signals at speeds exceeding 40 Gbps and a photomixer capable of producing a terahertz wave have been developed (Non-Patent Literature 1 and Non-Patent Literature 2).

Non-Patent Literature 1 discloses a PD using a plasmonic waveguide having the metal-semiconductor-metal structure, which is called the MSM structure. This PD includes a core 302 made of Si formed on a substrate 301 made of $SiO_2$, a first metal electrode 303 and a second metal electrode 304 between which the core 302 is inserted, and an upper electrode 306 formed on the core 302 with an insulating layer 305 interposed therebetween as illustrated in FIG. 6. The first metal electrode 303 is made of gold and serves as a drain electrode. The second metal electrode 304 is made of titanium and serves as a source electrode. A third electrode 307 made of gold is connected to the second metal electrode 304. The first metal electrode 303, the second metal electrode 304, and the core 302 interposed therebetween constitute a plasmonic waveguide.

When light of 1.5 μm wavelength, which is within a wavelength range of optical communication, is guided through the plasmonic waveguide composed of the core 302, the first metal electrode 303, and the second metal electrode 304, as illustrated FIG. 7, due to the excitation of metal surface plasmon polaritons (SPPs), the light distributes with a relatively high intensity at the interface between the core 302 (Si) and the first metal electrode 303 (Au) and the interface between the core 302 (Si) and the second metal electrode 304 (Ti), which is a light propagation mode (hereinafter also referred to as the "propagation mode of the plasmonic waveguide"). As for the light intensity distribution in the core 302 as a semiconductor, the SPPs excited at both left and right metal surfaces of the core 302 are confined by metals positioned opposite to each other, and as a result, it is possible to confine light in an area of subwavelength size, which known dielectric waveguides have been unable to achieve, resulting in an ultrasmall device structure.

The SPPs excited at the left and right metal surfaces of the core 302 excite energy of charge carriers in the first metal electrode 303 and the second metal electrode 304. When the energy of the excited wavelength (1.5 μm) travels over the interface between the core 302 and the first metal electrode 303 and the height of the Schottky barrier between the core 302 and the second metal electrode 304, the charge carriers excited in the first metal electrode 303 and the second metal electrode 304 can enter the core 302. The principal of such light detection is referred to as internal photoemission (IPE).

In the technology of Non-Patent Literature 1, firstly, bias voltage is applied between the first metal electrode 303 and the second metal electrode 304, and as a result, the Schottky barrier between the core 302 and the second metal electrode 304 is in the reverse bias state while the interface between the core 302 and the first metal electrode 303 is in the forward bias state (refer to FIG. 8). Under reverse bias, excited electrons in the second metal electrode 304 more easily flow into the conduction band of the core 302. Under forward bias, electrons are pulled to the first metal electrode 303 with low resistance. In this manner, the technology of Non-Patent Literature 1 enables the operation of the PD by obtaining photocurrent.

CITATION LIST

Non-Patent Literature

Non-Patent Literature 1: S. Muehlbrandt et al., "Silicon-plasmonic internal-photo emission detector for 40 Gbit/s data reception", Optical Society of America, vol. 3, no. 7, pp. 741-747, 2016.

Non-Patent Literature 2: T. Harter et al., "Silicon-Plasmonic Photomixer for Gene ration and Homodyne Reception of Continuous-Wave THz Radiation", Conference on Lasers and Electro-Optics, SM4E.5, 16542210, 2016.

Non-Patent Literature 3: H. Nishi et al., "Deep-subwavelength Si core plasmonic waveguide monolithically integrated with Si photonic waveguide", Conference on Lasers and Electro-Optics, FF1B.6, 16543044, 2016.

Non-Patent Literature 4: H. Nishi et al., "High-speed Si plasmonic photodetector based on internal photoemission and two-photon absorption", Conference on Lasers and Electro-Optics, SM2I.5, 18024143, 2018.

SUMMARY

Technical Problem

In Non-Patent Literature 1, as illustrated in FIG. 7, 50% or more of the light propagating through the plasmonic waveguide is distributed at the interface between Au and Si, which is one side of the MSM structure; thus, 50% or more of the energy conversion (photoelectric conversion) of light entering the plasmonic waveguide into electrons occurs in the vicinity of the interface between Au and Si. Hence, there is significant problem in which, when the operation is carried out under the bias condition described in the Non-Patent Literature 1, that is, the bias condition in which electrons excited due to the energy conversion caused in the vicinity of the other interface between Ti and Si flow in, the electrons excited in the vicinity of the interface between Au and Si do not contribute to photoelectric conversion, and as a result, the efficiency of photoelectric conversion falls to 50% or lower in principle.

Conversely, with the technology of Non-Patent Literature 1, when the operation is carried out under the bias condition in which electrons flow in from the interface between Au and Si, it is possible to achieve 50% or higher efficiency of photoelectric conversion in principle. Furthermore, it can be considered that, with the technology of Non-Patent Literature 1, if the presence of the electromagnetic field can be increased at a metal interface through which excited electrons flow in by changing the material of the metal electrode to optimize the propagation mode of the plasmonic waveguide, the efficiency of the photoelectric conversion can be improved.

However, in these cases, the distribution of the electromagnetic field in the propagation mode of the plasmonic waveguide becomes less symmetrical in a transverse direction. In Non-Patent Literature 1, an Si waveguide used for input and output is coupled with the plasmonic waveguide via a mode converter having a taper structure; however, since the Si waveguide has a propagation mode with extremely high symmetry, there is a problem in which, when the propagation mode with extremely high symmetry is coupled to a plasmonic waveguide mode with low symmetry, the mode converter having the taper structure as in Non-Patent Literature 1 may cause relatively high coupling loss, and consequently, the conversion efficiency may decrease.

Embodiments of the present invention have been made to address the problems described above, and an object thereof is to improve the energy conversion of incident light into electrons without decreasing the degree of symmetry in the propagation mode of a plasmonic waveguide.

Means for Solving the Problem

An optical device according to embodiments of the present invention includes a core made of a semiconductor and formed on a substrate, a first source electrode and a second source electrode that are made of a metal and formed in contact with both side surfaces of the core interposed between the first source electrode and the second source electrode, and a drain electrode made of a metal and formed in contact with an upper surface of the core. The core, the first source electrode, and the second source electrode together form a plasmonic waveguide.

In a configuration example of the optical device, the first source electrode and the second source electrode are Schottky coupled to the core.

In a configuration example of the optical device, the first source electrode and the second source electrode are respectively made of different metals.

In a configuration example of the optical device, the optical device further includes a mode converter joined to one end of the core on the substrate and transitorily widened toward one end of the mode converter opposite to the core.

Effects of Embodiments of the Invention

As described above, in embodiments of the present invention, the first source electrode and the second source electrode made of a metal are provided in contact with both side surfaces of the core made of a semiconductor interposed between the first source electrode and the second source electrode, and the drain electrode is disposed on the upper surface of the core; as a result, the energy conversion of incident light into electrons can be improved without decreasing the degree of symmetry in the propagation mode of the plasmonic waveguide.

DETAILED DESCRIPTION OF ILLUSTRATIVE EMBODIMENTS

Figure 1:
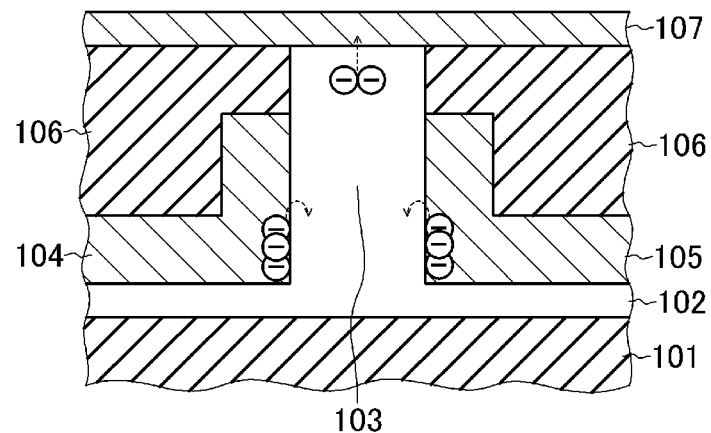
FIG. 1 is a sectional view illustrating a structure of an optical device according to an embodiment of the present invention.

Hereinafter, an optical device according to an embodiment of the present invention will be described with reference to FIGS. 1 and 2. This optical device includes a core 103 formed on a substrate 101, a first source electrode 104 and a second source electrode 105 formed in contact with both side surfaces of the core 103 interposed between the first source electrode 104 and the second source electrode 105, and a drain electrode 107 formed in contact with an upper surface of the core 103. The core 103, the first source electrode 104, and the second source electrode 105 together form a plasmonic waveguide.

The first source electrode 104 and the second source electrode 105 are Schottky coupled to the core 103. In the present embodiment, the core 103 is disposed in a standing manner on a slab 102 to form a rib waveguide structure. Additionally, in the embodiment, insulating layers 106 are formed on the first source electrode 104 and the second source electrode 105, and the drain electrode 107 is formed on the core 103 and the insulating layers 106. FIG. 1 illustrates a section in a direction perpendicular to the waveguide direction of the plasmonic waveguide.

The substrate 101 is made of an insulator such as silicon oxide. The core 103 is made of a semiconductor such as Si. The section of the core 103 perpendicular to the waveguide direction is the size of 200 nm width and 400 nm height. The first source electrode 104 and the second source electrode 105 are made of a metal such as Al. The thickness of the first source electrode 104 and the second source electrode 105 is 40 nm. The drain electrode 107 is made of a metal such as Al. The drain electrode 107 is electrically coupled to the core 103. The insulating layers 106 are made of an insulator such as silicon oxide. The first source electrode 104 and the second source electrode 105 may be respectively made by using a combination of different kinds of metals that can achieve a high degree of symmetry in the propagation mode of plasmonic waveguide, such as the combination of gold and titanium.

The optical device according to the present embodiment has a lateral metal-semiconductor-metal (MSM) structure in which the first source electrode 104, the core 103, and the second source electrode 105 are arranged in the order presented in the direction along a surface of the substrate 101. In the optical device according to the present embodiment, voltage is applied to the first source electrode 104 and the second source electrode 105 to cause reverse bias at Schottky barriers formed between the semiconductor forming the core 103 and the metal forming the first source electrode 104 and between the semiconductor forming the core 103 and the metal forming the second source electrode 105. As a result, charge carriers excited at the interface between the core 103 and the first source electrode 104 or the second source electrode 105 enter the core 103. Further, voltage is applied to the drain electrode 107 to pull the charge carriers entering the core 103 from the drain electrode 107.

As such, in the optical device according to the present embodiment, photo-excited carriers are supplied from the vicinity of the interface between the core 103 and the first source electrode 104 and the interface between the core 103 and the second source electrode 105. Thus, it is possible to extract as a photocurrent photo-excited carriers that cannot be used in known plasmonic waveguide photodetectors (PDs) using internal photoemission (IPE) as the operation principle because the photo-excited carriers cannot enter the core. As described above, the present embodiment can form a plasmonic waveguide PD with high conversion efficiency by using a simple optical structure. Unlike the existing common PDs, the semiconductor forming the core does not need to be made of a material capable of absorbing a desired light wavelength; the high-performance PD can be produced by using, for example, a semiconductor material used for common electronic devices, such as Si, and an electrode material used in Si electronic circuits.

Figure 2:
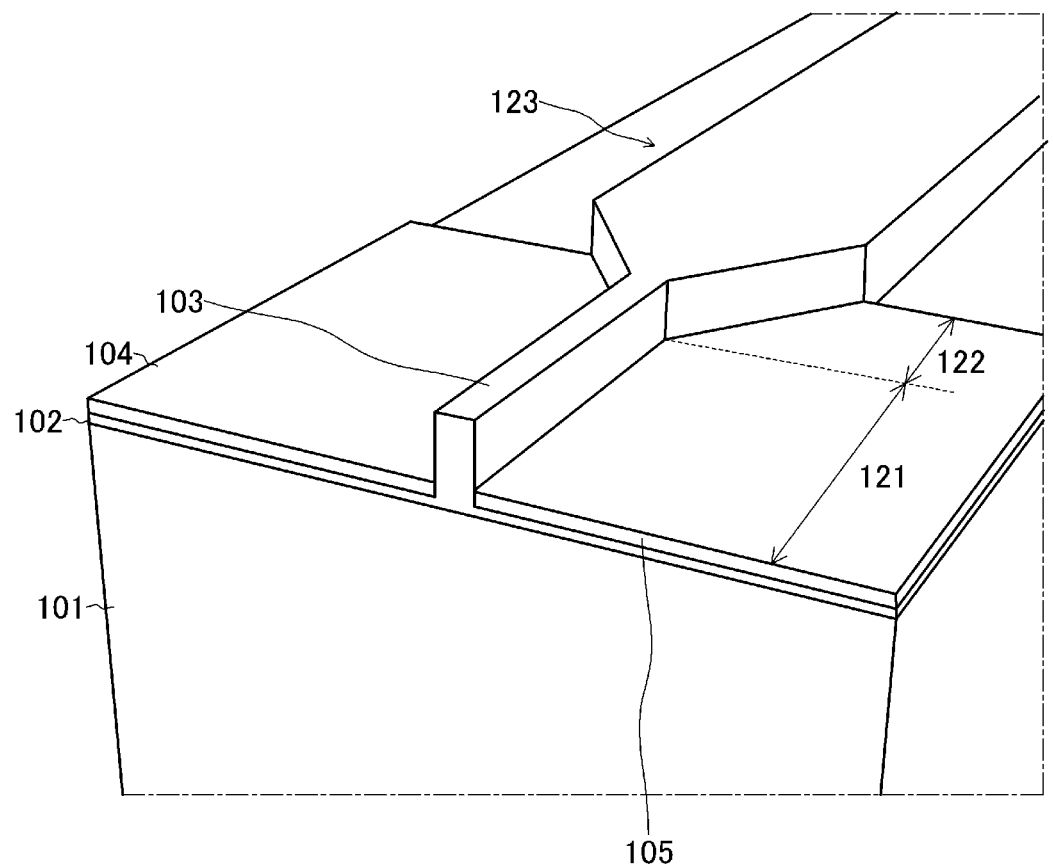
FIG. 2 is a perspective view illustrating the structure of the optical device according to an embodiment of the present invention.

In the optical device according to the present embodiment, a mode converter 122 can be optically coupled to a plasmonic waveguide 121 as illustrated in FIG. 2. A Si waveguide 123 using a silicon core is optically coupled to the mode converter 122. A conversion core of the mode converter 122 is joined to one end of the core 103 over the substrate 101. The conversion core is widened toward one end opposite to the core 103. The drain electrode is omitted in FIG. 2.

Incident light from the Si waveguide 123 enters the plasmonic waveguide 121 through the mode converter 122. The section of the core of the Si waveguide 123 is formed in a size of conventional common design, such as 200*450 nm. In consideration of the fabrication process, the slabs of 20 nm thickness are arranged on both sides of the core. The core width of the mode converter 122 decreases from 450 nm to a core width of the plasmonic waveguide 121 to be linearly tapered.

The core width of the plasmonic waveguide 121 is, for example, 100 nm. The length of the mode converter 122 in the waveguide direction is, for example, 500 nm. The thickness of the slab 102 is, for example, 20 nm. As described in Non-Patent Literature 3 and Non-Patent Literature 4, the first source electrode 104 and the second source electrode 105, which form a lateral MSM structure of the plasmonic waveguide 121, are arranged in contact with the respective side surfaces of the Si core of the mode converter 122 tapered to decrease the width.

Figure 3:
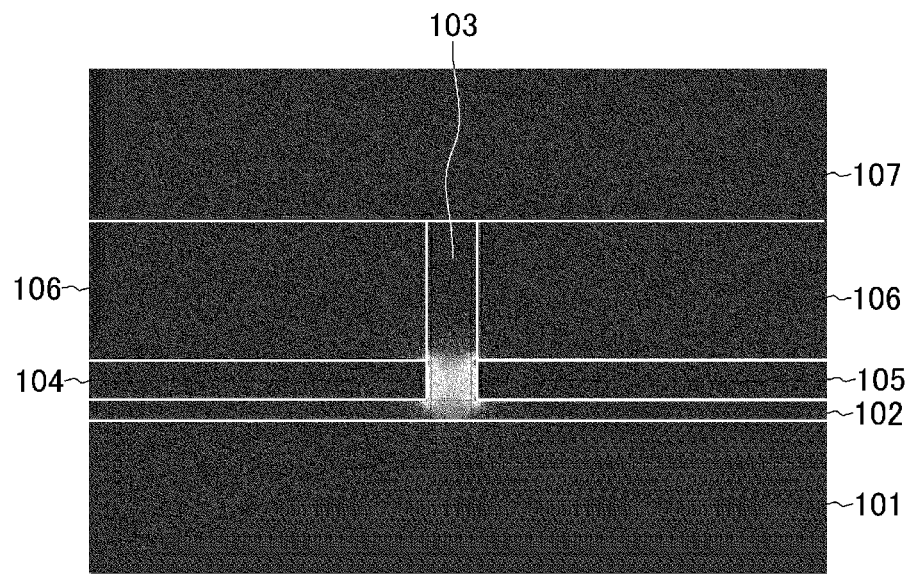
FIG. 3 illustrates a state in a mode of the optical device according to an embodiment of the present invention.

After light (incident light) entering from the Si waveguide 123 propagates through the mode converter 122, the light reaches the plasmonic waveguide 121, where the light is distributed with a relatively high intensity especially at the interface between the core 103 made of Si and the first source electrode 104 made of Al and the interface between the core 103 made of Si and the second source electrode 105 made of Al as illustrated in FIG. 3. This means that, in this example, light is confined in a small area of the size of a core width of about 100 nm and an electrode thickness of about 40 nm.

In the plasmonic waveguide 121, which is configured to guide incident light after the light propagates through the mode converter 122 and is converted into light in a propagation mode of the plasmonic waveguide 121, the drain electrode 107 is disposed on the core 103. In the propagation mode of the plasmonic waveguide 121, as illustrated in FIG. 3, light is thoroughly confined in the lateral MSM structure, and thus the existence of the drain electrode 107 does not strongly affect the propagation mode of the plasmonic waveguide 12L This means that the lateral MSM structure defines the structure for confining light, and the height of the core 103 (distance to the drain electrode 107) is designed to reduce the effect of the drain electrode 107 on the propagation mode of the lateral MSM structure.

Figure 4:
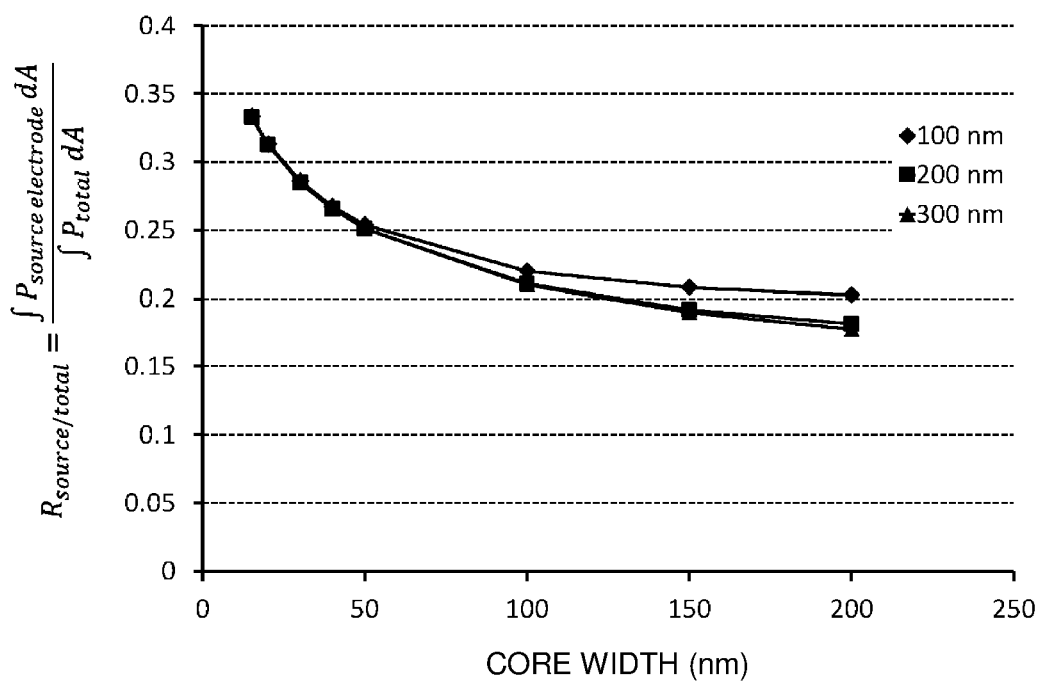
FIG. 4 is a graph illustrating a characteristic of a relationship between the ratio ($R_{source/total}$) of the light intensity in a source electrode ($\int P_{sourceelectrode} dA$) to the total light intensity in a plasmonic propagation mode ($\int JP_{total} dA$), which is computed by employing the finite element method, and the width of a core.

FIG. 4 illustrates a relationship between the ratio ($R_{source/total}$) of the light intensity in the source electrode ($\int P_{sourceelectrode}dA$) to the total light intensity in the plasmonic propagation mode ($\int P_{total}dA$), which is computed by employing the finite element method, and the width of the core 103. In this computation, the height of the core 103 (core height) is 100, 200, or 300 nm; the thickness of the first source electrode 104 and the second source electrode 105 ($h_{metal}$) is 20 nm.

With any core height, as the core width decreases, $R_{source/total}$ increases; in other words, a larger amount of light exists in the source electrode in which IPE occurs, which results in a higher level of sensitivity. When the core width is determined to be as narrow as 50 nm or less, $R_{source/total}$ does not significantly change among the core heights 100, 200, and 300 nm; thus, when the core height is as low as 100 nm, the existence of the drain electrode 107 hardly affects the propagation mode of the plasmonic waveguide 121.

Figure 5:
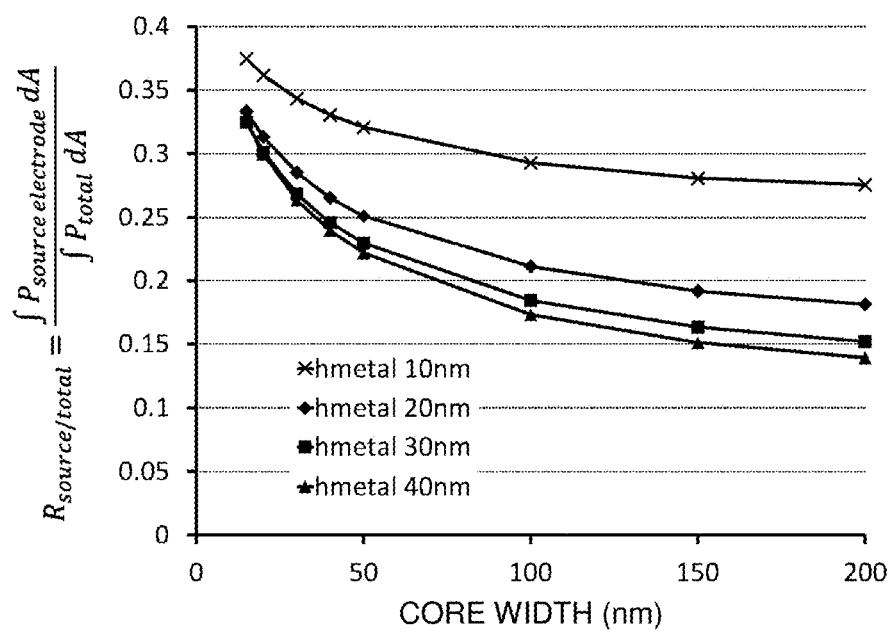
FIG. 5 is a graph illustrating a characteristic of a relationship between $R_{source/total}$, which is also computed by employing the finite element method, and the width of the core.
Figure 6:
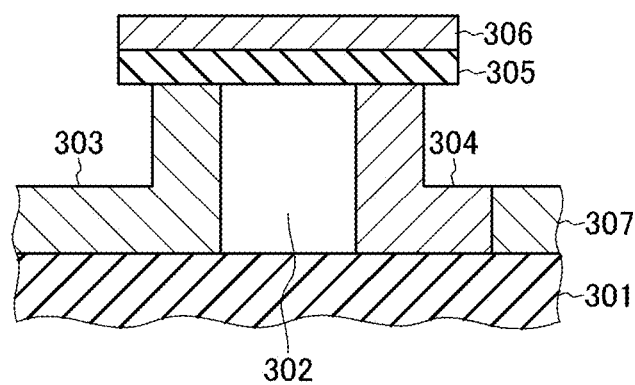
FIG. 6 is a sectional view illustrating a structure of a photodetector disclosed in Non-Patent Literature 1.
Figure 7:
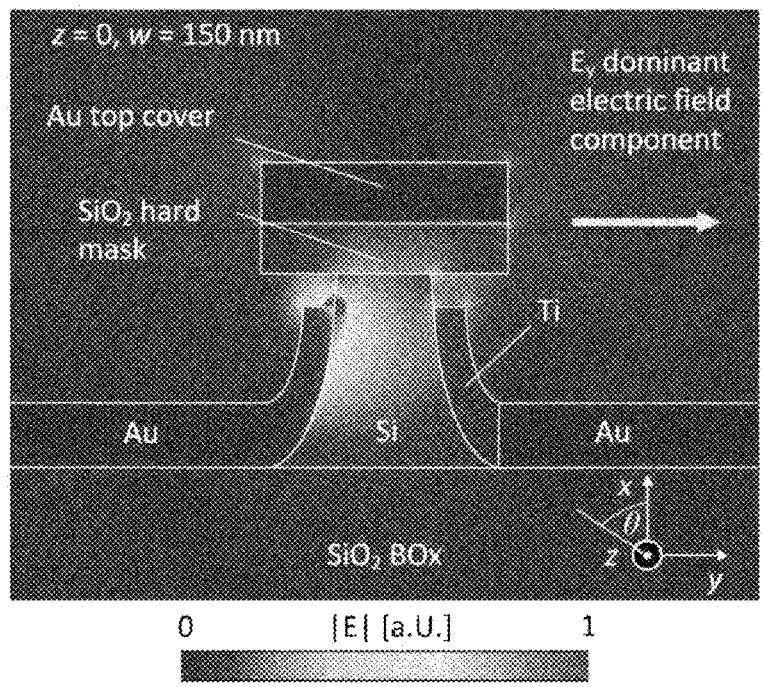
FIG. 7 is a distribution diagram illustrating a state in the mode illustrated in FIG. 4 of Non-Patent Literature 1.
Figure 8:
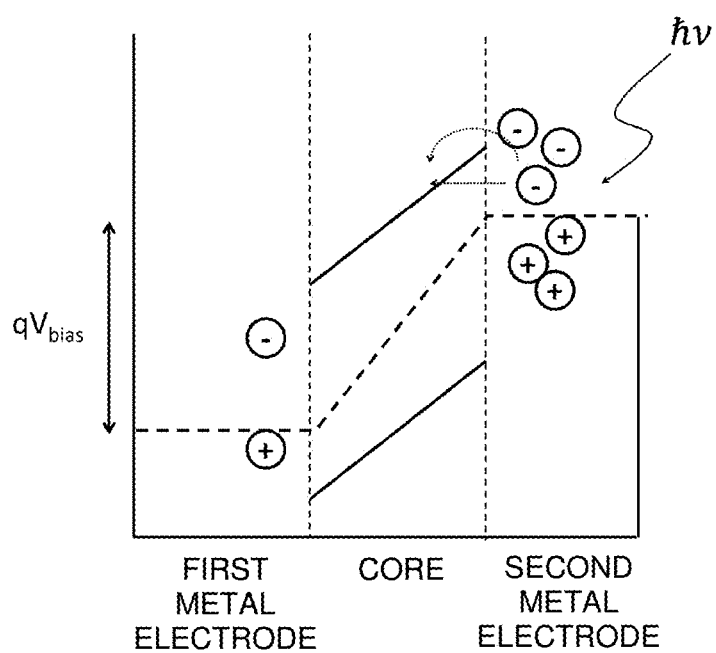
FIG. 8 is a diagram for explaining an operation of the photodetector disclosed in Non-Patent Literature 1.

FIG. 5 illustrates a relationship between $R_{source/total}$, which is also computed by employing the finite element method, and the core width. Unlike the computation results presented in FIG. 4, FIG. 5 presents computational results when the core height is 200 nm and $h_{metal}$ is 10, 20, 30, or 40 nm. With any $h_{metal}$, as the core width decreases, $R_{source/total}$ increases; in other words, a larger amount of light exists in the source electrode in which IPE occurs, which results in a higher level of sensitivity.

As indicated by these computational results, to render the conversion efficiency as high as possible with the structure according to embodiments of the present invention, the core width and $h_{metal}$ are configured to be as small as possible to render $R_{source/total}$ as great as possible.

While in the present embodiment described above the first source electrode, the second source electrode, and the drain electrode are all made of the same metallic material, this should not be construed in a limiting sense; the first source electrode, the second source electrode, and the drain electrode may be made of different metallic materials. In this case, to render $R_{source/total}$ as high as possible in the propagation mode of the plasmonic waveguide, the material of the first source electrode and the second source electrode is selected to satisfy the following conditions: SPPs can be excited at the interface between the core formed of a semiconductor and the first source electrode and the interface between the core and the second source electrode; Schottky barriers can be formed between the core and the first source electrode and the second source electrode; the Schottky barrier height does not exceed a detected wavelength. As the material of the drain electrode, a particular material is selected to enable the drain electrode to create with the core a Schottky barrier junction or an ohmic junction with a resistance as low as possible under forward bias. The metallic material is not limited to a single composition, but, for example, a silicide material can be selected when the silicide material satisfies the conditions described above. It is preferable that the core is made of Si, which has relatively high resistance.

To further increase the detection efficiency, the core may be made of a material (semiconductor) capable of absorbing light of a detection target wavelength. For example, to absorb light in the 1.3 μm wavelength range or the 1.5 μm wavelength range, the core may be made of, for example, Ge or InGaAs, and the source electrode may be made of a metal that also satisfies the conditions described above. Alternatively, by using a characteristic of the plasmonic waveguide structure in which an extremely high electric field intensity can be achieved in the core because light is confined in an ultrasmall area, when a multiple photon absorption process in the core made of a semiconductor can be used, in the case in which a selected material is incapable of linearly absorbing a target wavelength, photocarriers can be generated in the core, and as a result, the detection efficiency can be increased.

While in the present embodiment slabs are disposed on both sides of the core for convenience in consideration of the fabrication process, the structure is not limited to this example, and no slab may be provided for the core.

As described above, in embodiments of the present invention, the first source electrode and the second source electrode made of a metal are provided in contact with both side surfaces of the core made of a semiconductor interposed between the first source electrode and the second source electrode, and the drain electrode is disposed on the upper surface of the core; as a result, the energy conversion of incident light into electrons can be improved without decreasing the degree of symmetry in the propagation mode of the plasmonic waveguide. Embodiments of the present invention can form a plasmonic waveguide PD with a higher level of conversion efficiency than that of known technologies by using a mode converter having a simple tapered structure.

It should be noted that the present invention is not limited to the embodiments described above, and it is apparent that many kinds of modifications and combinations can be made by those skilled in the art without departing from the spirit and scope of the present invention.

REFERENCE SIGNS LIST

101 Substrate
102 Slab
103 Core
104 First source electrode
105 Second source electrode
106 Insulating layer
107 Drain electrode

The invention claimed is:

1. An optical device comprising:
    a core on a substrate, wherein the core comprises a semiconductor material;
    a first source electrode and a second source electrode respectively in contact with opposite side surfaces of the core that is interposed between the first source electrode and the second source electrode, wherein the first source electrode comprises a first metal material and the second source electrode comprises a second metal material, and wherein the core, the first source electrode, and the second source electrode together define a plasmonic waveguide; and
    a drain electrode in contact with an upper surface of the core, wherein the drain electrode comprises a third metal material.

2. The optical device according to claim 1, wherein the first source electrode and the second source electrode are Schottky coupled to the core.

3. The optical device according to claim 1, wherein the first metal material and the second metal material comprise different metal materials.

4. The optical device according to claim 1, further comprising a mode converter joined to one end of the core on the substrate and transitorily widened toward one end of the mode converter opposite to the core.

5. The optical device according to claim 1, wherein the first metal material, the second metal material, and the third metal material each comprise a same metal.

6. A method for forming an optical device, the method comprising:
    forming a core on a substrate, wherein the core comprises a semiconductor material;
    forming a first source electrode and a second source electrode in contact with opposite side surfaces of the core that is interposed between the first source electrode and the second source electrode, wherein the first source electrode comprises a first metal material and the second source electrode comprises a second metal material, and wherein the core, the first source electrode, and the second source electrode together define a plasmonic waveguide; and
    forming a drain electrode in contact with an upper surface of the core, wherein the drain electrode comprises a third metal material.

7. The method according to claim 6, wherein the first source electrode and the second source electrode are Schottky coupled to the core.

8. The method according to claim 6, wherein the first metal material and the second metal material comprise different metal materials.

9. The method according to claim 6, further comprising joining a mode converter to one end of the core on the substrate, wherein the mode converter is transitorily widened toward an end of the mode converter that is opposite to the core.

10. The method according to claim 6, wherein the first metal material, the second metal material, and the third metal material each comprise a same metal material.

* * * * *